United States Patent [19]
Su et al.

[11] Patent Number: 6,037,223
[45] Date of Patent: Mar. 14, 2000

[54] STACK GATE FLASH MEMORY CELL FEATURING SYMMETRIC SELF ALIGNED CONTACT STRUCTURES

[75] Inventors: Hung-Der Su, Kaohsiung County; Chrong-Jung Lin, Hsin-Tien; Jong Chen, Taipei; Di-Son Kuo, Hsinchu, all of Taiwan

[73] Assignee: Taiwan Semiconductor Manufacturing Company, Ltd., Hsin-Chu, Taiwan

[21] Appl. No.: 09/177,342

[22] Filed: Oct. 23, 1998

[51] Int. Cl.[7] .................................................. H01L 21/8247
[52] U.S. Cl. ........................................... 438/257; 438/264
[58] Field of Search ..................................... 438/257–267

[56] References Cited

U.S. PATENT DOCUMENTS

| | | | |
|---|---|---|---|
| 5,631,179 | 5/1997 | Sung et al. | 438/264 |
| 5,705,438 | 1/1998 | Tseng | 438/238 |
| 5,734,607 | 3/1998 | Sung et al. | 365/185.01 |
| 5,741,719 | 4/1998 | Kim . | |
| 5,763,303 | 6/1998 | Liaw et al. | 438/210 |
| 5,766,992 | 6/1998 | Chou et al. | 438/241 |
| 5,821,143 | 10/1998 | Kim et al. | 438/267 |
| 5,899,722 | 5/1999 | Huang | 438/305 |
| 5,998,252 | 12/1999 | Huang | 438/241 |

*Primary Examiner*—Richard Booth
*Attorney, Agent, or Firm*—George O. Saile; Stephen B. Ackerman

[57] ABSTRACT

A process for fabricating a flash memory cell, featuring self-aligned contact structures, overlying and contacting, self-aligned source, and self-aligned drain regions, located between stack gate structures, has been developed. The stack gate structures, located on an underlying silicon dioxide, tunnel oxide layer, are comprised of: a capping insulator shape; a polysilicon control gate shape; an inter-polysilicon dielectric shape; and a polysilicon floating gate shape. The use of self-aligned contact structures, and self-aligned source regions, allows increased cell densities to be achieved.

30 Claims, 6 Drawing Sheets

STACK GATE FLASH MEMORY CELL FEATURING SYMMETRIC SELF ALIGNED CONTACT STRUCTURES

BACKGROUND OF THE INVENTION (1) Field of the Invention

The present invention relates to processes used to fabricate semiconductor devices, and more specifically to a process used to fabricate a flash memory cell.

(2) Description of the Prior Art

The use of flash memory devices allow data to be stored in a non-volatile mode, and allows the stored data to be erased and rewritten as desired. The term flash refers to the ability to erase numerous memory cells simultaneously. However, if more aggressive processes and designs, resulting in smaller cell areas, are not implemented, performance and cost objectives, for flash memory chips, will be difficult to achieve.

This invention will teach a process for creating a self-aligned contact, (SAC), structure, for flash memory cells, resulting in a reduction in cell area. The use of the SAC structure, removes the need of providing contact holes to source regions, thus saving a photolithographic procedure. In addition the use of the symmetric SAC structure design, used in this invention, will be more conducive to future micro-miniaturization trends, than counterpart flash memory cells, fabricating using conventional contacts to source/drain regions. Prior art, such as Sung et al, in U.S. Pat. No. 5,734,607, describe a process for fabricating self-aligned bit line contact structures, whereas the present invention describes symmetric SAC structures, to both source, and to drain regions, which in turn have been self-aligned to stack gate structures, of a flash memory device, comprised with both control gate, and floating gate shapes.

SUMMARY OF THE INVENTION

It is an object of this invention to fabricate a flash memory cell using stack gate structures, comprised of: a control gate; an inter-polysilicon dielectric layer; and a floating gate; overlying a tunnel oxide layer.

It is another object of this invention to create SAC structures, between insulator capped, stack gate structures, contacting source, and drain regions, located in a semiconductor substrate, between insulator capped, stack gate structures.

In accordance with the present invention a method of creating a flash memory cell, featuring SAC structures, to source, and to drain regions, located between stack gate structures, comprised with a control gate layer, as well as a floating gate layer, is described. After formation of isolation regions, in the semiconductor substrate, a tunnel oxide layer is grown on the regions of the semiconductor substrate, not covered by the isolation regions. A first polysilicon layer, is next deposited, and patterned to create a first polysilicon shape, which will be used as the floating gate structure of the flash memory cell. After formation of an inter-polysilicon dielectric layer, on the underlying first polysilicon shape, deposition a second polysilicon layer is performed, followed by the deposition of a capping insulator layer. Photolithographic and anisotropic reactive ion etching, (RIE), procedures are next employed to create the stacked gate structures, comprised of: a capping insulator layer; a second polysilicon shape, used as the control gate of the flash memory cell; an inter-polysilicon dielectric layer; and a first polysilicon shape, used as the floating gate of the flash memory cell; overlying the tunnel oxide layer. After formation of an insulator spacer, on the sides of the stacked gate structures, self-aligned source/drain regions are formed in regions of the semiconductor substrate, not covered by the stacked gate structures. After deposition of a composite interlevel dielectric, (ILD), layer, completely filling the spaces between the stacked gate structures, followed by planarization of the composite ILD layer, photolithographic and selective RIE procedures, are used to create openings in the composite ILD layer, with the openings larger in width than the space between stacked gate structures, but as a result of the selective RIE procedure, only exposing source/drain region, located between the insulator spacers, on the stacked gate structures. A tungsten layer is next deposited, followed by removal of unwanted regions of tungsten, resulting in tungsten SAC structures, overlying and contacting, source/drain regions, in the openings between stacked gate structures. A metal layer is than deposited, and patterned, creating individual metal interconnect structures, to SAC structures contacting drain regions of the flash memory cell, while also creating a metal interconnect structure, connecting a series of source regions, via contact to underlying SAC structures, which in turn overlaid, and contacting, the desired source regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a flash memory cell, incorporating SAC structures, to source/drain regions, located self-aligned between stacked gate structures, will now be described in detail. This invention will be described using an N type, source/drain regions, however if desired this invention can be applied to P type, source/drain regions.

Figure 1:
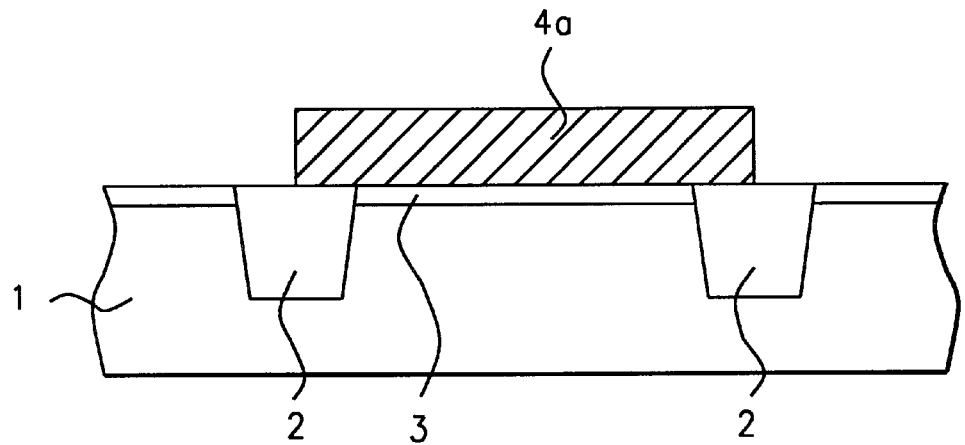
FIGS. 1, 2, 3B, 4–6, 7B, and 8B, which schematically, in cross-sectional style, show the key stages of fabrication used to create the flash memory cell, featuring the SAC structures.

A P type, semiconductor substrate 1, comprised of single crystalline silicon with a <100> crystallographic orientation, is used and schematically shown in FIG. 1. Isolation regions 2, either shallow trench isolation, (STI), or thermally formed, field oxide, (FOX), are next formed in semiconductor substrate 1, at a thickness between about 3000 to 8000 Angstroms. STI regions are formed via etching a shallow trench, in semiconductor substrate 1, via conventional photolithographic and RIE procedures, using $Cl_2$ as an etchant, followed by deposition of a silicon oxide layer, via low pressure chemical vapor deposition, (LPCVD), or plasma enhanced chemical vapor deposition, (PECVD), procedures, and removal of unwanted regions of silicon oxide, via a selective RIE procedure, using CHF, as an etchant, or via a chemical mechanical polishing, (CMP), procedure, resulting in the insulator filled, shallow trench. The FOX isolation region, would be formed via thermal oxidation of regions of semiconductor substrate 1, not covered by a oxidation resistant mask pattern, such as silicon nitride. After formation of the FOX region, the oxidation resistant mask pattern is removed, exposing the subsequent device region. This is schematically shown in FIG. 1.

After formation of isolation regions 2, tunnel oxide layer 3, comprised of silicon dioxide, is thermally grown in an oxygen—steam ambient, at a temperature between about 800 to 1000° C., to a thickness between about 80 to 120 Angstroms. A first polysilicon layer is next deposited via LPCVD procedures, to a thickness between about 700 to 1500 Angstroms, an doped insitu, during deposition, via the addition of arsine, or phosphine, to a silane ambient. Photolithographic and anisotropic RIE procedures, using $Cl_2$ as an etchant, are employed to create first polysilicon shape 4a, or floating gate structure 4a, schematically shown in FIG. 1. First polysilicon shape 4a, will subsequently be patterned to create a floating gate shape, for the flash memory cell. The photoresist shape, used to create first polysilicon shape 4a, is removed via plasma oxygen ashing and careful wet cleans.

Figure 2:
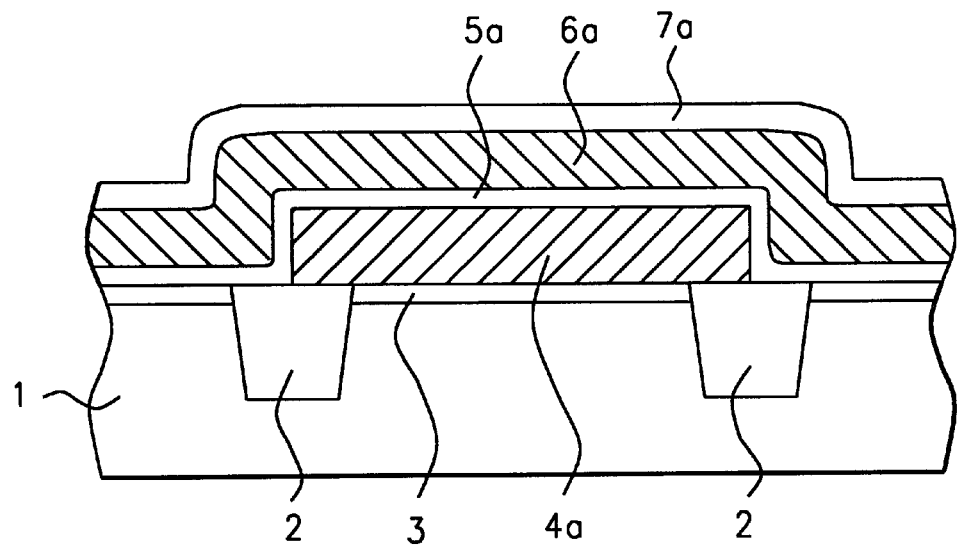

A inter-polysilicon dielectric layer 5a, such as silicon oxide layer, a silicon nitride layer, or a silicon oxide—silicon nitride—silicon oxide composite layer, is next deposited using LPCVD, PECVD, or high density plasma chemical vapor deposition, (HDPCVD), procedures, or thermal oxidation procedures can also be used to create the silicon oxide option, all resulting in a thickness between about 100 to 300 Angstroms. A deposition of a second polysilicon layer 6a, follows, using LPCVD procedures, at a thickness between about 1500 to 3000 Angstroms, again in situ doped, during deposition, via the addition of arsine, or phosphine, to a silane ambient, to be used subsequently for the control gate shape of the flash memory cell. A composite insulator layer 7a, such as silicon nitride, silicon oxide, or silicon oxide—silicon nitride—silicon oxide, is then deposited, via LPCVD, PECVD, or HDPCVD procedures, with the composite insulator layer 7a, used as a capping insulator layer, at a thickness between about 1000 to 3000 Angstroms. The result of these depositions are schematically shown in FIG. 2.

Figure 3A:
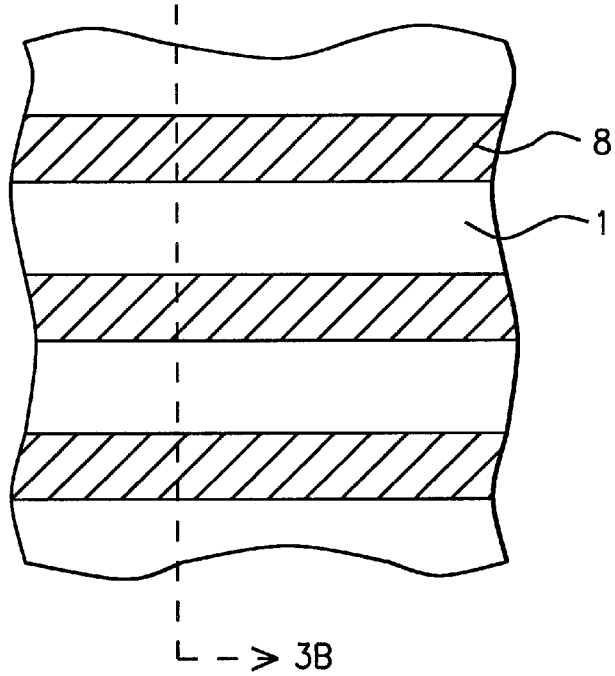
FIGS. 3A, 7A, and 8A, which schematically show the top view of the flash memory cell, at key stages of fabrication.
Figure 3B:
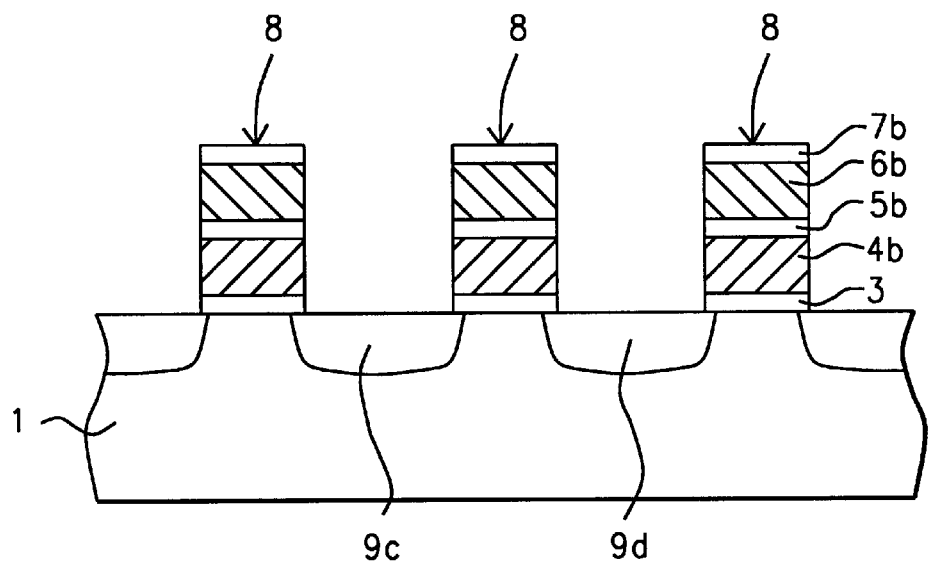

Photolithographic and RIE procedures are next employed to create stacked gate structures 8, schematically shown in cross-sectional representation, in FIG. 3B. The anisotropic RIE procedure is performed using $CF_4$—HBr as an etchant for composite, capping insulator layer 7a, using $Cl_2$ for second polysilicon layer 6a, and for first polysilicon shape 4a, while CHF, is used to pattern inter-polysilicon dielectric layer 5a. The stacked gate structure, comprised of: composite, capping insulator shape 7b, control gate, second polysilicon shape 6b, inter-polysilicon dielectric shape 5b, and floating gate, first polysilicon shape 4b, reside on tunnel oxide layer 3. FIG. 3A, schematically shows a top view of the flash memory cell, at this stage of processing.

Figure 4:
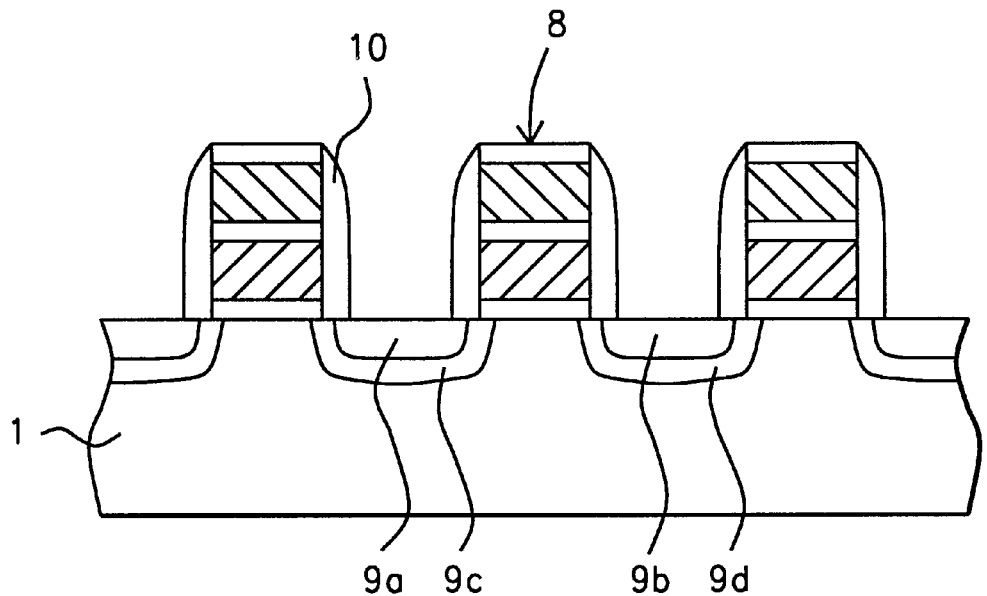

Lightly doped drain region 9c, and lightly doped source region 9d, are next formed via an ion implantation procedure, at an energy between about 30 to 60 KeV, and at a dose between about 5E13 to 5E14 atoms/cm$^2$, using phosphorous ions, with the lightly doped source/drain region self-aligned to the adjacent stack gate structures 8. Insulator spacers 10, schematically shown in FIG. 4, are formed via deposition of an insulator layer, such as silicon nitride, via LPCVD or PECVD procedures, at a thickness between about 1000 to 2500 Angstroms, followed by an anisotropic RIE procedure, using $CF_4$ as an etchant. Heavily doped drain region 9a, and heavily doped source region 9b, are next formed via an ion implantation procedure, at an energy between about 30 to 60 KeV, at a dose between about 5E14 to 1E16 atoms/cm$^2$, using arsenic or phosphorous ions, with the heavily doped source/drain region self-aligned to the adjacent stack gate structures.

Figure 5:
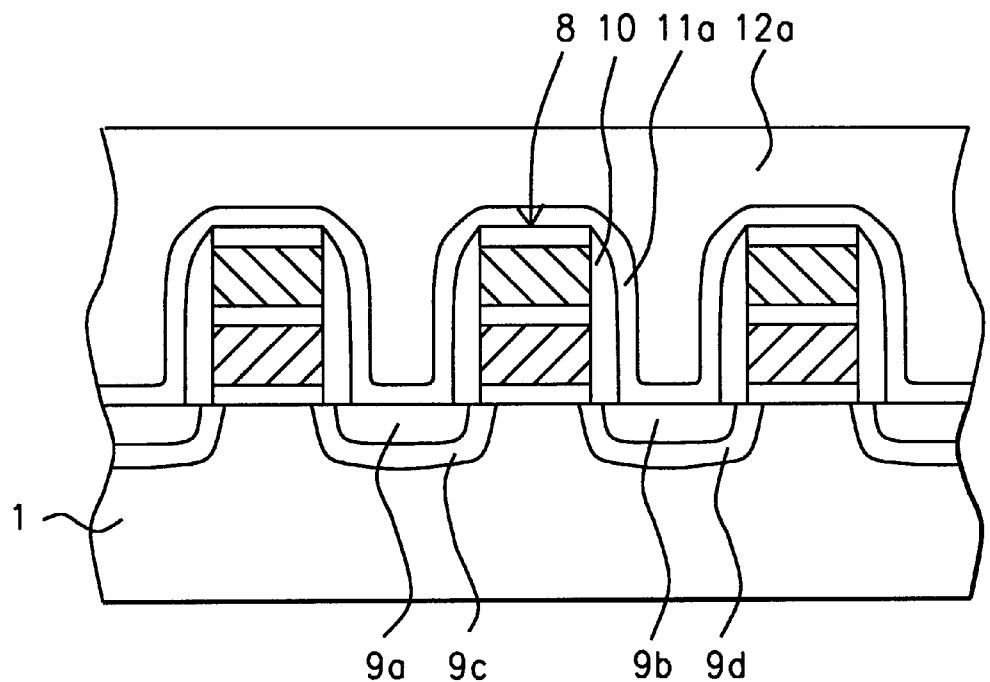

Insulator layer 11a, shown schematically in FIG. 5, comprised of silicon nitride, is next deposited, using LPCVD or PECVD procedures, to a thickness between 400 to 1000 Angstroms. Interlevel dielectric, (ILD), layer 12a, comprised of silicon oxide, obtained via LPCVD or PECVD procedures, at a thickness between about 8000 to 15000 Angstroms, is then deposited, completely filling the spaces between stacked gate structures 8. Planarization of ILD layer 12a, is then accomplished via a CMP procedure, resulting in a smooth top surface topology for ILD layer 12a, schematically shown in FIG. 5, reducing the severity of the subsequent, photolithographic procedure, used for the openings to source/drain regions.

Figure 6:
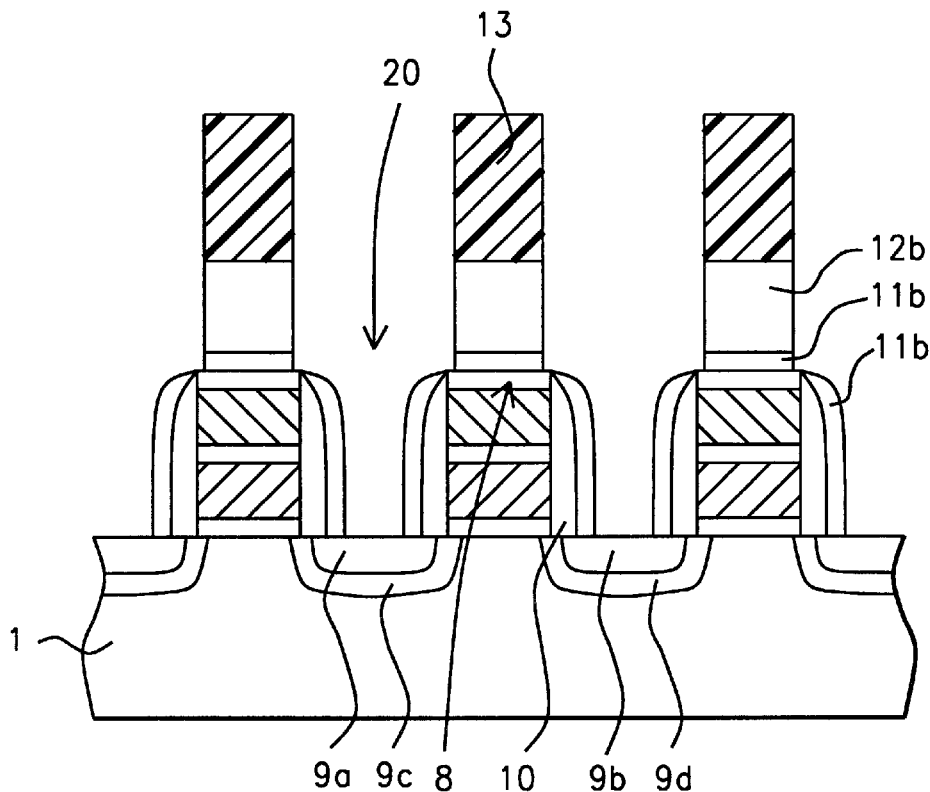
Figure 7A:
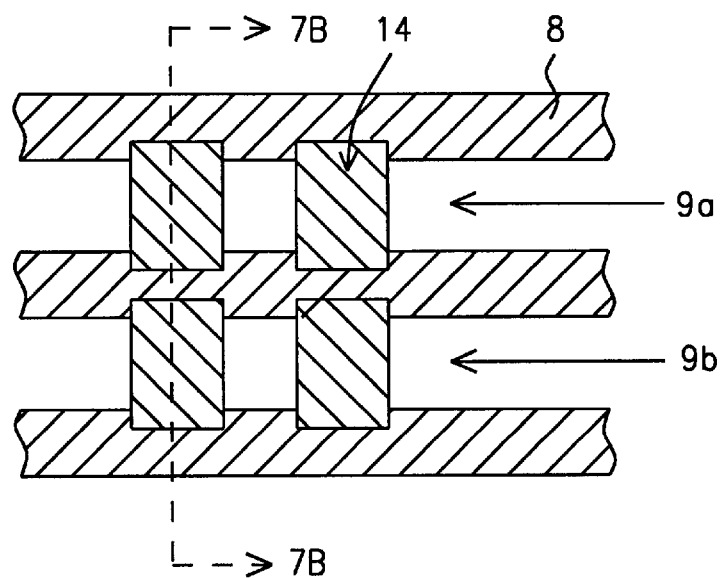
Figure 7B:
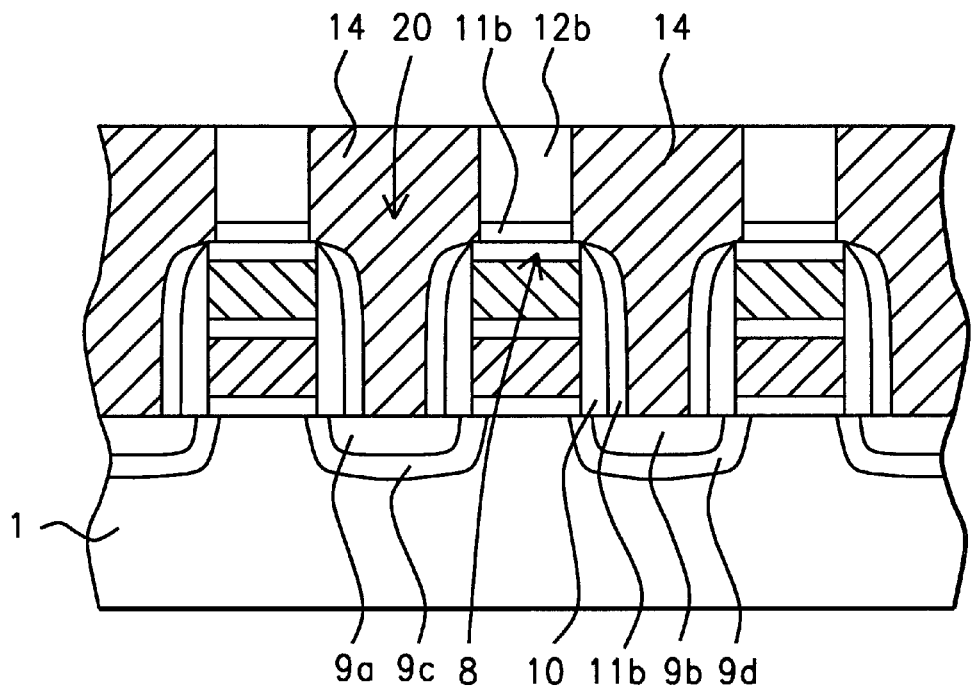

Photoresist shape 13, is next used as a mask to allow an anisotropic RIE procedure to create openings 20. Openings 20, with a width between about 8000 to 15000 Angstroms, wider then the space between stacked gate structures 8, is created via a RIE procedure, using $CHF_3$ as an etchant for ILD layer 12a, while using $CF_4$ as an etchant for insulator layer 11a. This procedure results in the creation of openings 20, in the composite insulator layer, comprised of ILD layer 12a, and underling insulator layer 11a. The RIE procedure features the creation of insulator spacers 11b, overlying insulator spacers 10, and the creation of ILD shape 12b, on insulator shape 11b, overlying stacked gate structures 8. This is schematically shown in FIG. 6. After removal of photoresist shape 13, via plasma oxygen ashing and careful wet cleans, a metal layer such as tungsten, at a thickness between about 3000 to 5000 Angstroms, is deposited via LPCVD procedures, using tungsten hexafluoride as a source, completely filling openings 20. (The tungsten layer can also be obtained via R.F. sputtering procedures). Removal of the tungsten layer, residing on the top surface of ILD shapes 12b, is accomplished via a CMP procedure, or via a selective RIE procedure, using $Cl_2$ as an etchant, resulting in SAC structures 14, in openings 20, schematically shown in cross-sectional style in FIG. 7B, and shown schematically as a top view, in FIG. 7A. Some of the symmetrically designed pattern of SAC structures 14, shown in FIG. 7A, contact drain region 9a, while other SAC structures are contacting source region 9b. If desired, the SAC structures can be fabricated using doped polysilicon, obtained via LPCVD procedures, to a thickness between about 1500 to 3000 Angstroms, and doped in situ, during deposition, via the addition of arsine or phosphine, to a silane ambient. The SAC structures can also be comprised of a metal silicide layer, such as tungsten silicide.

Figure 8A:
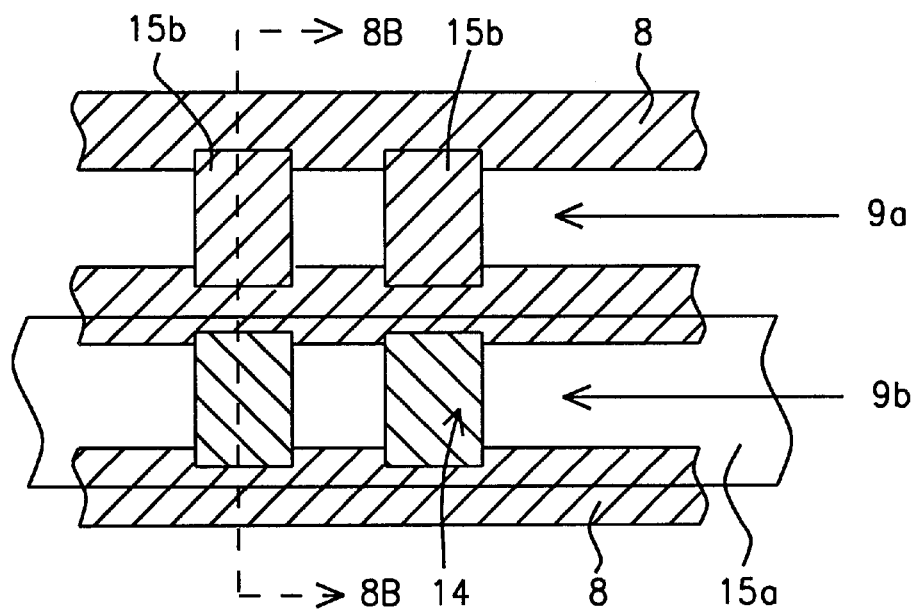
Figure 8B:
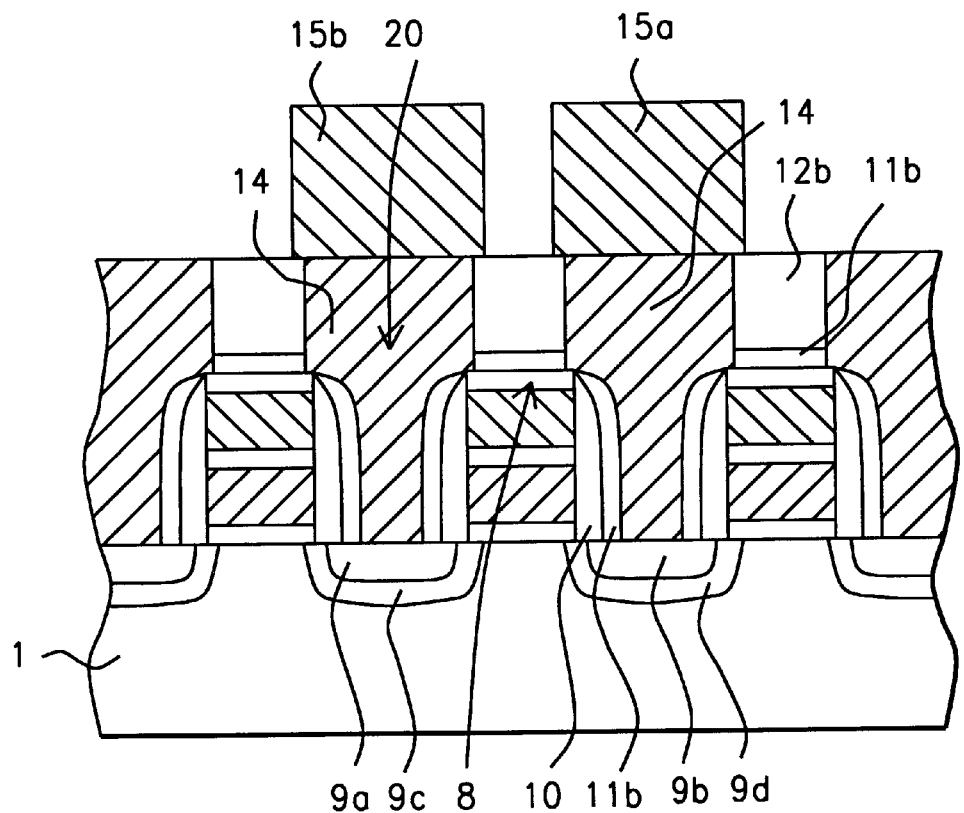

A metal layer, such as an aluminum layer, comprised with between about 0.5 to 4.0 weight percent of copper, is next deposited, via R.F. sputtering, to a thickness between about 3000 to 8000 Angstroms. Conventional photolithographic and anisotropic RIE procedures, using $Cl_2$ as an etchant, are used to create metal interconnect structures 15b, each contacting a SAC structure 14, which in turn contacts a drain region 9a. The same photolithographic and anisotropic RIE procedure, also creates metal interconnect line 15a, overlying and contacting a series SAC structures, which in turn overlay and contact, several source regions 9b. This is schematically shown, in cross-sectional style in FIG. 8B, and schematically for the top view in FIG. 8A. The design for the flash memory cell, with symmetric SAC structures, shown in FIG. 8a, results in: a reduction cell size, when compared to counterpart cells fabricated without SAC structures; a reduction in a masking level, (avoiding the use of a self-aligned source mask), via the use of source/drain regions, self-aligned to stacked gate structures; and the absence of a source pickup, due to the metal connection to the source region, via the SAC structures. The photoresist shape used to define metal structures 15b, and metal structure 15a, is again removed via plasma oxygen ashing and careful wet cleans.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a flash memory cell, on a semiconductor substrate, comprising the steps of:

growing a tunnel oxide layer on said semiconductor substrate;

forming a floating gate structure, from a first polysilicon silicon layer, on said tunnel oxide layer, with an inter-polysilicon dielectric layer, overlying said floating gate structure;

depositing a second polysilicon layer, and an overlying composite, capping insulator layer, on said underlying inter-polysilicon dielectric layer;

forming stack gate structures, on said tunnel oxide layer, with each stack gate structure comprised of: a composite, capping insulator shape; a control gate shape, formed from said second polysilicon layer; an inter-polysilicon dielectric shape; and a floating gate shape, formed from said floating gate structure;

forming a lightly doped source region, in a first region of said semiconductor substrate, not covered by a first set of stack gate structures;

forming a lightly doped drain region, in a second region of said semiconductor substrate, not covered by a second set of stack gate structures;

forming insulator spacers on said stack gate structures;

forming a heavily doped source region, in said first region of said semiconductor substrate, not covered by a first set of stack gate structures, or by said insulator spacers;

forming a heavily doped drain region, in a second region of said semiconductor substrate, not covered by a second set of stack gate structures, or by said insulator spacers;

forming a first set of openings in an interlevel dielectric layer, exposing the top surface of said source region, located between the stack gate structures, of said first set of stack gate structures;

forming a second set of openings in said interlevel dielectric layer, exposing the top surface of said drain region, located between the stack gate structures, of said second set of stack gate structures;

forming a first set of SAC structures, in said first set of openings in said interlevel dielectric layer, with said first set of SAC structures contacting said heavily doped source region;

forming a second set of SAC structures, in said second set of openings in said interlevel dielectric layer, with said second set of SAC structures contacting said heavily doped drain region;

forming a group of metal interconnect structures, with each metal interconnect structure, of said group of metal interconnect structures, contacting an underlying SAC structure, from said second group of said SAC structures; and forming a metal interconnect line, overlying and contacting said first set of SAC structures, with said first set of SAC structures, contacting said heavily doped source region.

2. The method of claim 1, wherein said tunnel oxide layer is comprised of silicon dioxide, thermally grown in an oxygen—steam ambient, at a temperature between about 800 to 1000° C., to a thickness between about 80 to 120 Angstroms.

3. The method of claim 1, wherein said first polysilicon layer is obtained via LPCVD procedures, to a thickness between about 700 to 1500 Angstroms, and doped in situ, during deposition, via the addition of arsine, or phosphine, to a silane ambient.

4. The method of claim 1, wherein said floating gate structure is formed via an anisotropic RIE procedure, performed to said first polysilicon layer, using $Cl_2$ as an etchant.

5. The method of claim 1, wherein said inter-polysilicon dielectric layer is chosen from a group including, silicon nitride, silicon oxide, or silicon oxide—silicon nitride—silicon oxide, obtained via LPCVD or PECVD procedures, to a thickness between about 100 to 300 Angstroms, or the silicon oxide layer, from said group, can be thermally grown in an oxygen—steam ambient, at a temperature between about 700 to 1000° C., to a thickness between about 100 to 300 Angstroms.

6. The method of claim 1, wherein said second polysilicon layer is deposited via LPCVD procedures, to a thickness between about 1500 to 3000 Angstroms, and doped in situ, during deposition, via the addition of arsine, or phosphine, to a silane ambient.

7. The method of claim 1, wherein said composite, capping insulator layer is comprised of silicon oxide—silicon nitride—silicon oxide, obtained via LPCVD or PECVD procedures, at a thickness between about 1000 to 3000 Angstroms, or said composite, capping insulator layer is comprised of silicon nitride—silicon oxide, obtained via LPCVD or PECVD procedures, at a thickness between about 1000 to 3000 Angstroms.

8. The method of claim 1, wherein said stack gate structures are formed via anisotropic RIE procedures, using: $CF_4$—HBr as an etchant for said composite, capping insulator layer; $Cl_2$ as an etchant to form said control gate shape, from said second polysilicon layer; $CHF_3$ as an etchant for said inter-polysilicon dielectric layer; and $Cl_2$ as an etchant to form said floating gate structure, from said first polysilicon layer.

9. The method of claim 1, wherein said lightly doped drain region, and lightly doped source region, are formed via ion implantation of phosphorous ions, at an energy between about 30 to 60 KeV, at a dose between about 5E13 to 5E14 atoms/$cm_2$.

10. The method of claim 1, wherein said insulator spacers are comprised of silicon nitride, obtained via LPCVD or PECVD deposition, at a thickness between about 1000 to 2500 Angstroms, followed by an anisotropic RIE procedure, using $CF_4$ as an etchant.

11. The method of claim 1, wherein said heavily doped drain region, and said heavily doped source region, are formed via ion implantation of arsenic ions, at an energy between about 30 to 60 KeV, at a dose between about 5E14 to 1E16 atoms/$cm^2$.

12. The method of claim 1, wherein said interlevel dielectric layer is silicon oxide, obtained via LPCVD or PECVD procedures, to a thickness between about 8000 to 15000 Angstroms.

13. The method of claim 1, wherein said first set of SAC structures, and said second set of SAC structures, are comprised of tungsten, obtained via LPCVD procedures, to a thickness between about 3000 to 5000 Angstroms, using tungsten hexafluoride as a source.

14. The method of claim 1, wherein said first set of SAC structures, and said second set of SAC structures, are comprised of polysilicon, obtained via LPCVD procedures, to a thickness between about 1500 to 3000 Angstroms, and doped in situ during deposition, via the addition of arsine, or phosphine, to a silane ambient.

15. The method of claim 1, wherein said group of metal interconnect structures, and said metal interconnect line, is comprised of an aluminum based layer, obtained via R.F. sputtering procedures, to a thickness between about 3000 to 8000 Angstroms, containing between about 0.5 to 4.0 weight percent copper.

16. A method of fabricating a flash memory cell, on a semiconductor substrate, incorporating SAC structures to contact source/drain regions, located, and self-aligned, between stack gate structures, comprising the steps of:

forming isolation regions in said semiconductor substrate;

forming a silicon dioxide, tunnel oxide layer, on the region of said semiconductor substrate, not covered by said isolation regions;

depositing a first polysilicon layer on said silicon dioxide, tunnel oxide layer;

patterning of said first polysilicon layer, to form a floating gate structure, on said silicon dioxide, tunnel oxide layer;

depositing an inter-polysilicon dielectric layer, on said floating gate structure, and on regions of said silicon dioxide, tunnel oxide layer, not covered by said control gate structure;

depositing a second polysilicon layer, on said inter-polysilicon dielectric layer;

depositing a composite, capping insulator layer, on said second polysilicon layer;

patterning of said composite, capping insulator layer, of said second polysilicon layer, of said inter-polysilicon dielectric layer, and of said floating gate structure, to form stack gate structures, on said silicon dioxide, tunnel oxide layer, with each stack gate structure comprised of: a composite, capping insulator shape; a control gate shape, formed from said second polysilicon layer; an inter-polysilicon dielectric shape; and a floating gate shape, formed from said floating gate structure;

forming a self-aligned source region, in a first region of said semiconductor substrate, between a first set of stack gate structures;

forming a self-aligned drain region, in a second region of said semiconductor substrate, between a second set of stack gate structures;

forming silicon nitride spacers on the sides of said stack gate structures;

forming a heavily doped, self aligned source region, in a first region of said semiconductor substrate, between a first set of stack gate structures, with said first set of stack gate structures comprised with said silicon nitride spacers;

forming a heavily doped, self-aligned drain region, in a second region of said semiconductor substrate, between a second set of stack gate structures, with said second set of stack gate structures comprised with said silicon nitride spacers;

depositing a composite, interlevel dielectric layer, completely filling the spaces between said stack gate structures;

creating a first set of openings, in said composite, interlevel dielectric layer, exposing said heavily doped, self-aligned source region, located between said first set of said stack gate structures;

creating a second set of openings, in said composite, interlevel dielectric layer, exposing said heavily doped, self-aligned drain region, located between said second set of said stack gate structures;

depositing a tungsten layer;

removal of said tungsten layer, from the top surface of said composite, interlevel dielectric layer, creating a first set of tungsten SAC structures, contacting said heavily doped, self-aligned source region, in said first set of openings, and a second set of tungsten SAC structures, contacting said heavily doped, self-aligned drain region, in said second set of openings;

depositing a metal layer; and patterning of said metal layer: to form metal interconnect structures, with each metal interconnect structure contacting a tungsten SAC structure, from the group of said second set of tungsten SAC structures; and to form a metal interconnect line, contacting the underlying, said first set of said tungsten SAC structures.

17. The method of claim 16, wherein said silicon dioxide, tunnel oxide layer is thermally grown, in an oxygen—steam ambient, at a temperature between about 800 to 1000° C., to a thickness between about 80 to 120 Angstroms.

18. The method of claim 16, wherein said first polysilicon layer is deposited using LPCVD procedures, to a thickness between about 700 to 1500 Angstroms, and doped in situ, during deposition, via the addition of arsine, or phosphine, to a silane ambient.

19. The method of claim 16, wherein said floating gate structure is patterned via an anisotropic RIE procedure, using $Cl_2$ as an etchant.

20. The method of claim 16, wherein said inter-polysilicon dielectric layer, is chosen from a group comprised of silicon oxide, silicon nitride, or silicon oxide—silicon nitride—silicon oxide, at a thickness between about 100 to 300 Angstroms, and is obtained either via LPCVD or PECVD procedures, or via a thermal oxidation procedure, performed in an oxygen—steam ambient, at a temperature between about 700 to 1000° C., to obtain said silicon oxide layer, from said group.

21. The method of claim 16, wherein said second polysilicon layer is obtained via LPCVD procedures, to a thickness between 1500 to 3000 Angstroms, an doped in situ, during deposition, via the addition of arsine, or phosphine, to a silane ambient.

22. The method of claim 16, wherein said composite, capping insulator layer is either a silicon oxide—silicon nitride—silicon oxide layer, or a silicon nitride—silicon oxide layer, obtained via LPCVD or PECVD procedures, with either said composite, capping insulator layers having a thickness between about 1000 to 3000 Angstroms.

23. The method of claim 16, wherein said stack gate structure is formed via an anisotropic RIE procedure, using $CF_4$—HBr as an etchant for said composite, capping insulator layer, using $Cl_2$ as an etchant for said second polysilicon layer, and for said floating gate shape, and using $CHF_3$ as an etchant for said inter-polysilicon dielectric layer.

24. The method of claim 16, wherein said self-aligned source region, and self-aligned drain region, are faoned via ion implantation of phosphorous ions, at an energy between about 30 to 60 KeV, at a dose between about 5E13 to 5E15 atoms/$cm^2$.

25. The method of claim 16, wherein said silicon nitride spacers are formed from a layer of silicon nitride, obtained via LPCVD or PECVD procedures, at a thickness between about 1000 to 2500 Angstroms, followed by anisotropic etching, using $CF_4$ as an etchant.

26. The method of claim 16, wherein said heavily doped, self-aligned source region, and said heavily doped, self-aligned drain region, are formed via ion implantation of arsenic ions, at an energy between about 30 to 60 KeV, at a dose between about 5E14 to 2E16 atoms/cm$^2$.

27. The method of claim 16, wherein said composite, interlevel dielectric layer is comprised of an underlying silicon nitride layer, obtained via LPCVD or PECVD procedures, at a thickness between about 400 to 1000 Angstroms, and an overlying silicon oxide layer, obtained via LPCVD or PECVD procedures, at a thickness between about 8000 to 15000 Angstroms.

28. The method of claim 16, wherein said first set of openings, and said second set of openings, are created in said composite, interlevel dielectric layer, via an anisotropic RIE procedure, using $CHF_3$ as an etchant for silicon oxide, while using $CF_4$ as an etchant for silicon nitride.

29. The method of claim 16, wherein said tungsten SAC structures are formed via deposition of a tungsten layer, via R.F. sputtering, or LPCVD procedures, at a thickness between about 3000 to 5000 Angstroms, followed by removal of unwanted regions of tungsten via a CMP procedure, or via a selective, anisotropic RIE procedure using $Cl_2$ as an etchant.

30. The method of claim 16, wherein said metal interconnect structures, and said metal interconnect line, are comprised of an aluminum based layer, at a thickness between about 3000 to 8000 Angstroms, with said metal interconnect structure, and said metal interconnect line, containing between about 0.5 to 4.0 weight percent copper.

* * * * *